(12) United States Patent
Tarumi et al.

(10) Patent No.: US 10,629,716 B2
(45) Date of Patent: Apr. 21, 2020

(54) SEMICONDUCTOR DEVICE INCLUDING SWITCHING DEVICE HAVING FOUR-TERMINAL STRUCTURE

(71) Applicant: DENSO CORPORATION, Kariya, Aichi-pref. (JP)

(72) Inventors: Hiroyuki Tarumi, Kariya (JP); Kazuhiro Oyama, Kariya (JP); Youngshin Eum, Kariya (JP); Shinichi Hoshi, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/092,492

(22) PCT Filed: Apr. 6, 2017

(86) PCT No.: PCT/JP2017/014410
§ 371 (c)(1),
(2) Date: Oct. 10, 2018

(87) PCT Pub. No.: WO2017/203849
PCT Pub. Date: Nov. 30, 2017

(65) Prior Publication Data
US 2019/0123187 A1 Apr. 25, 2019

(30) Foreign Application Priority Data

May 24, 2016 (JP) .................. 2016-103352
Dec. 7, 2016 (JP) .................. 2016-237723

(51) Int. Cl.
*H01L 29/778* (2006.01)
*H01L 29/78* (2006.01)
(Continued)

(52) U.S. Cl.
CPC ............ *H01L 29/778* (2013.01); *H01L 24/00* (2013.01); *H01L 29/0619* (2013.01);
(Continued)

(58) Field of Classification Search
CPC combination set(s) only.
See application file for complete search history.

(56) References Cited

U.S. PATENT DOCUMENTS

2007/0102727 A1    5/2007  Twynam
2008/0149965 A1*   6/2008  Kaibara ............ H01L 29/1066
                                                          257/192

(Continued)

OTHER PUBLICATIONS

"GaN Power Device", NEC Electronics Seminar, Nov. 8, 2011, POWDEC K.K., pp. 1-30. (and partial English translation).

*Primary Examiner* — Nduka E Ojeh
(74) *Attorney, Agent, or Firm* — Posz Law Group, PLC

(57) ABSTRACT

A semiconductor device has a lateral switching device that includes a channel forming layer, a gate structure portion, a source electrode, a drain electrode, a third semiconductor layer, a fourth semiconductor layer, and a junction gate electrode. The gate structure portion has a gate insulating film provided in a recess portion of the channel forming layer and a MOS gate electrode functioning as a gate electrode of a MOS structure provided on the gate insulating film. The source electrode and the junction gate electrode are coupled through an electrode layer provided on an interlayer insulating film covering the MOS gate electrode. An end of the third semiconductor layer facing the drain electrode protrudes toward the drain electrode from an end of the fourth semiconductor layer facing the drain electrode by a distance in a range of 1 μm to 5 μm both inclusive.

9 Claims, 12 Drawing Sheets

(51) Int. Cl.
- *H01L 29/205* (2006.01)
- *H01L 29/808* (2006.01)
- *H01L 29/06* (2006.01)
- *H01L 23/00* (2006.01)
- *H01L 29/20* (2006.01)
- *H01L 29/417* (2006.01)
- *H01L 29/423* (2006.01)

(52) U.S. Cl.
CPC ........ *H01L 29/205* (2013.01); *H01L 29/7786* (2013.01); *H01L 29/78* (2013.01); *H01L 29/808* (2013.01); *H01L 29/2003* (2013.01); *H01L 29/41758* (2013.01); *H01L 29/4236* (2013.01); *H01L 29/7832* (2013.01)

(56) References Cited

U.S. PATENT DOCUMENTS

| | | | |
|---|---|---|---|
| 2013/0075752 A1* | 3/2013 | Kotani | H01L 29/42316 257/76 |
| 2013/0221409 A1 | 8/2013 | Nakajima et al. | |
| 2013/0292699 A1* | 11/2013 | Ueno | H01L 29/778 257/76 |
| 2016/0020207 A1* | 1/2016 | Tsuchiya | H01L 23/528 257/401 |
| 2016/0093691 A1* | 3/2016 | Echigoya | H01L 29/861 257/76 |
| 2017/0263710 A1 | 9/2017 | Matsumoto et al. | |
| 2018/0248026 A1 | 8/2018 | Eum et al. | |

* cited by examiner

SEMICONDUCTOR DEVICE INCLUDING SWITCHING DEVICE HAVING FOUR-TERMINAL STRUCTURE

CROSS REFERENCE TO RELATED APPLICATIONS

This application is a U.S. national phase of International Application No. PCT/JP2017/014410 filed on Apr. 6, 2017 and is based on Japanese Patent Application No. 2016-103352 filed on May 24, 2016 and Japanese Patent Application No. 2016-237723 filed on Dec. 7, 2016, the disclosures of which are incorporated herein by reference.

TECHNICAL FIELD

The present disclosure relates to a semiconductor device including a heterojunction structure of a first gallium nitride (hereinafter, abbreviated to GaN)-based semiconductor layer and a second GaN-based semiconductor layer, for example, formed by laminating GaN and aluminum gallium nitride (hereinafter, abbreviated to AlGaN) on a substrate.

BACKGROUND

A HEMT (High Electron Mobility Transistor) of a 4-terminal structure has been proposed as a lateral switching device including a heterojunction structure in Non-Patent Literature 1.

In the proposed switching device, a heterojunction structure is formed by laminating an i-GaN layer and an i-AlGaN layer on a sapphire substrate or the like. A gate electrode of a MOS structure (hereinafter, referred to as a MOS gate electrode) is provided to reach the i-GaN layer by penetrating through the i-AlGaN layer. A source electrode and a drain electrode are provided on both sides of a surface of the i-AlGaN layer with the MOS gate electrode in between. A laminated structure of an i-GaN layer and a p-GaN layer is formed on the surface of the i-AlGaN layer between the MOS gate electrode and the drain electrode. A junction gate electrode (hereinafter, referred to as a JG electrode) is provided on a surface of the p-GaN layer. The i-GaN layer and the p-GaN layer provided on the i-AlGaN layer reach close proximity to the drain electrode by protruding in a direction to the drain electrode more than the JG electrode does.

The switching device of a 4-terminal structure is formed by disposing the JG electrode and the MOS gate electrode between the source electrode and the drain electrode in the manner as above.

PRIOR ART LITERATURE

Non-Patent Literature

Non-Patent Literature 1: Koji Kawai collaborated with Akira Nakajima, "GaN Power Device—Singijyutsu niyori teikosuto wo mezasu", NE Electronics Seminar "GaN Power Device", Nov. 8, 2011, Kagaku Kaikan

SUMMARY

However, in the semiconductor device of the structure as above, a parasitic capacitance formed between the JG electrode and the drain electrode, to be more specific, a parasitic capacitance formed by a polarization junction is large. Hence, it takes a time to charge the parasitic capacitance when the switching device is turned off and a JFET formed on a side where the JG electrode exists is turned off more slowly, which interferes with a high-speed switching.

In a case where a switching device of a 4-terminal structure is formed, the JG electrode and the source electrode may have same potential when electrically connected by a bonding wire. However, when connected in such a manner, impedance between the JG electrode and the source electrode becomes large and interferes with a high-speed switching.

In view of the foregoing circumstances, an object of the present disclosure is to provide a semiconductor device having a junction structure and including a switching device capable of switching at a high speed.

A semiconductor device according to a first aspect of the present disclosure has a lateral switching device that includes a channel forming layer provided on a substrate and having a heterojunction structure formed of a first semiconductor layer made of a first GaN-based semiconductor forming a drift region and a second semiconductor layer made of a second GaN-based semiconductor having higher bandgap energy than the first GaN-based semiconductor and provided with a recess portion, a gate structure portion having a gate insulating film provided in the recess portion and a MOS gate electrode functioning as a gate electrode of a MOS structure provided on the gate insulating film, a source electrode and a drain electrode disposed on both sides of the second semiconductor layer with the gate structure portion in between, a third semiconductor layer made of a third GaN-based semiconductor undoped with an impurity and disposed on the second semiconductor layer at a location away from the drain electrode between the gate structure portion and the drain electrode, and a fourth semiconductor layer made of a p-type fourth GaN-based semiconductor and provided on the third semiconductor layer, and a JG electrode being in contact with the fourth semiconductor layer. In this configuration, the source electrode and the JG electrode are coupled through an electrode layer provided on an interlayer insulating film covering the MOS gate electrode, and an end of the third semiconductor layer facing the drain electrode protrudes toward the drain electrode from an end of the fourth semiconductor layer facing the drain electrode by a distance in a range of 0 µm to 5 µm both inclusive.

By directly coupling the JG electrode and the source electrode through the electrode layer as above, parasitic resistance and parasitic inductance can be reduced. Also, by disposing the third semiconductor layer and the fourth semiconductor layer away from the drain electrode, an opposing area of the third semiconductor layer and a 2DEG can be reduced to the least extent possible. Hence, a parasitic capacitance can be reduced.

By reducing impedance at L, C, and R between a drain of a JFET portion and the source electrode via a junction gate as above, a parasitic capacitance can be charged at a high speed. Because the JFET portion can be turned off at a high speed, turn-off of the switching device can be accelerated further. Consequently, the switching device becomes capable of switching at a higher speed.

DETAILED DESCRIPTION

Figure 1:
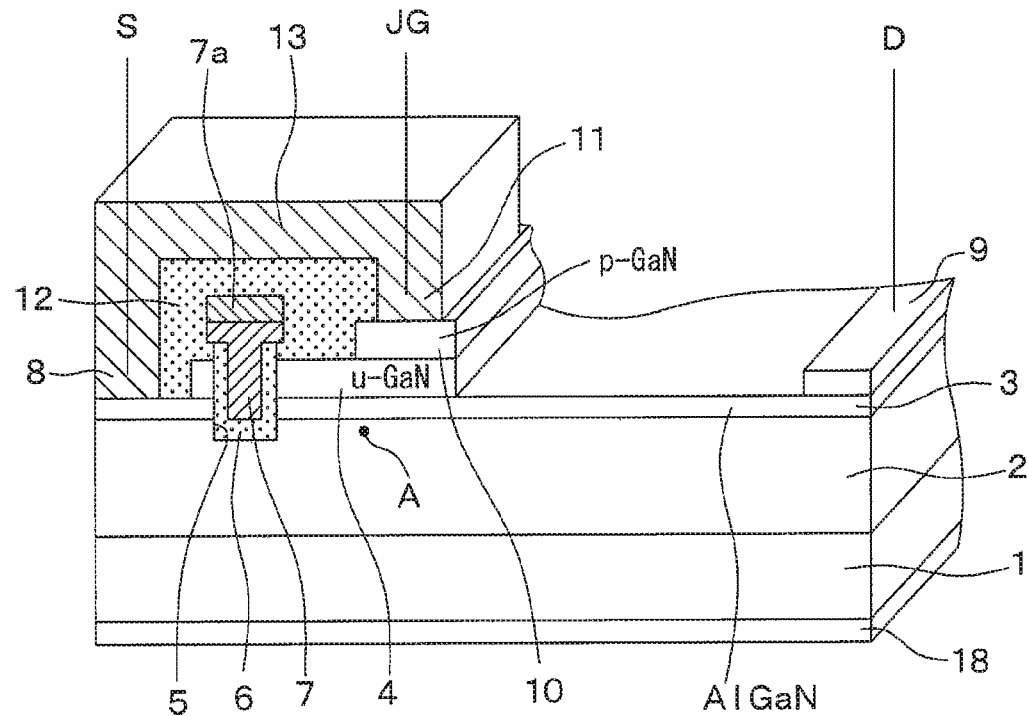
FIG. 1 is a sectional perspective view of a semiconductor device according to a first embodiment.

Hereinafter, embodiments of the present disclosure will be described according to the drawings. In respective embodiments below, a description will be given by labeling same or equivalent portions with same reference numerals.

First Embodiment

A semiconductor device according to a first embodiment will be described with reference to FIG. 1 through FIG. 8. FIG. 1 is a sectional view of elements in one cell included in the semiconductor device of the present embodiment. The semiconductor device includes multiple cells.

As is shown in FIG. 1, the semiconductor device of the present embodiment includes a 4-terminal HEMT as a lateral switching device.

The switching device of the present embodiment employs a compound semiconductor substrate formed by providing an undoped GaN (hereinafter, abbreviated to u-GaN) layer 2 on a surface of a substrate 1. An undoped AlGaN (hereinafter, abbreviated to u-AlGaN) layer 3 is provided on a surface of the u-GaN layer 2. A heterojunction structure is formed by the u-GaN layer 2 and the u-AlGaN layer 3. The u-GaN layer 2 and the u-AlGaN layer 3 function as a channel forming layer. A 2DEG carrier is induced by a piezoresistive effect and a spontaneous polarization effect in the u-GaN layer 2 at an AlGaN—GaN interface. The switching device operates when a carrier inducing region forms a channel where carriers flow.

The substrate 1 is made of a conductive material, such as a semiconductor material represented by Si(111) and SiC. The u-GaN layer 2 may be provided directly on the substrate 1 or a buffer layer functioning as a base film may be provided as needed to deposit the u-GaN layer 2 with satisfactory crystallizing properties. The buffer layer may be omitted when the u-GaN layer 2 can be deposited on the substrate 1 with satisfactory crystallizing properties. The term, "crystallizing properties", referred to herein means defects and dislocation in the u-GaN layer 2, which have an influence on electrical and optical characteristics.

The u-GaN layer 2 is a portion forming an electron transit layer functioning as a drift region and corresponds to a first GaN-based semiconductor layer. The u-GaN layer 2 is made of a GaN-based semiconductor material and a 2DEG is formed in a surface layer portion adjacent to the u-AlGaN layer 3.

The u-AlGaN layer 3, which corresponds to a second GaN-based semiconductor layer, is made of a GaN-based semiconductor material having higher bandgap energy than the GaN-based semiconductor material forming the u-GaN layer 2 and forms an electron supply portion.

When an Al-mixed crystal ratio is x, the u-AlGaN layer 3 is made of $Al_xGa_{1-x}N$. Concentration of the 2DEG formed in the vicinity of the surface of the u-GaN layer 2 is determined by the Al-mixed crystal ratio x, in the u-AlGaN layer 3 and a film thickness of the u-AlGaN layer 3. Hence, concentration of the 2DEG is adjusted by adjusting the Al-mixed crystal ratio x in the u-AlGaN layer 3 and a film thickness of the u-AlGaN layer 3 to be in a range within which concentration of the 2DEG does not vary considerably with a thickness but is determined uniquely by a Al-mixed crystal ratio x.

A u-GaN layer 4 undoped with an impurity is partially provided on a surface of the u-AlGaN layer 3.

The u-AlGaN layer 3 is provided on an entire top surface of the substrate 1 and the u-GaN layer 4 is provided in close proximity to a MOS gate electrode 7 described below on the u-AlGaN layer 3 and extended to protrude toward a drain electrode 9 described below. The u-AlGaN layer 3 and the u-GaN layer 4 are removed in a recess portion 5. The recess portion 5 is provided to extend in one direction, to be more specific, in a longitudinal direction which is a normal direction to the cross section of FIG. 1.

As a gate structure portion, the MOS gate electrode 7 is embedded in the recess portion 5 via a gate insulating film 6. More specifically, the gate insulating film 6 having a predetermined film thickness is deposited on an inner wall surface of the recess portion 5 and the gate structure portion is formed by further providing the MOS gate electrode 7 on the gate insulating film 6. The gate structure portion including the MOS gate electrode 7 is formed along the recess portion 5. Hence, as with the recess portion 5, the gate structure portion also extends along one direction.

The gate insulating film 6 is made of a silicon dioxide film ($SiO_2$), alumina ($Al_2O_3$), or the like. The MOS gate electrode 7 is made of metal, such as aluminum and platinum or a poly-semiconductor doped with an impurity. A gate structure portion of a MOS structure is formed by providing the gate insulating film 6 and the MOS gate electrode 7 in the recess portion 5. The entire MOS gate electrode 7 may be made of a poly-semiconductor or the like. However, a metal layer 7a is disposed on a surface portion of the MOS gate electrode 7 to reduce interconnection resistance of the MOS gate electrode 7.

Meanwhile, a source electrode 8 and the drain electrode 9 are provided on both sides of the surface of the u-AlGaN layer 3 with the gate structure portion in between. Both of the source electrode 8 and the drain electrode 9 are disposed at locations away from the u-GaN layer 4. A distance from an end of the u-GaN layer 4 to the drain electrode 9 is set to a predetermined length. The source electrode 8 and the drain electrode 9 each have ohmic contact.

A p-GaN layer 10 is provided on a surface of the u-GaN layer 4 in a portion between the MOS gate electrode 7 and the drain electrode 9. An end face of the p-GaN layer 10 facing the drain electrode 9 is flush with an end face of the u-GaN layer 4 facing the drain electrode 9 or closer to the MOS gate electrode 7 than the end face of the u-GaN layer 4 facing the drain electrode 9. In the present embodiment, a distance from the end face of the p-GaN layer 10 facing the drain electrode 9 to the end face of the u-GaN layer 4 facing the drain electrode 9 is set to fall within a range of 1 μm to 5 μm both inclusive.

A JG electrode 11 is provided on a surface of the p-GaN layer 10. The JG electrode 11 is coupled to the source electrode 8 and has same potential as the source electrode 8.

More specifically, an interlayer insulating film 12 is disposed to cover the MOS gate electrode 7, the u-GaN layer 4, and so on, and an electrode layer 13 is provided to cover the interlayer insulating film 12. The electrode layer 13 is in contact with the u-AlGaN layer 3 via a contact hole made in the interlayer insulating film 12 and also in contact with the p-GaN layer 10. In the electrode layer 13, a portion in contact with the u-AlGaN layer 3 forms the source electrode 8 and a portion in contact with the p-GaN layer 10 forms the JG electrode 11. In the manner as above, the source electrode 8 and the JG electrode 11 are formed of the same electrode layer 13. Hence, in comparison with a case where the source electrode 8 and the JG electrode 11 are connected by bonding wires or the like, interconnection resistance and inductance can be reduced.

The structure as above forms a 4-terminal switching device having the MOS gate electrode 7, the source electrode 8, the drain electrode 9, and the JG electrode 11. A semiconductor device of the present embodiment includes the switching device as above. A back surface electrode 18 is provided on a back surface of the substrate 1. The back surface electrode 18 is electrically connected to the source electrode 8 by, for example, unillustrated wiring and has same potential as the source electrode 8.

Figure 2:
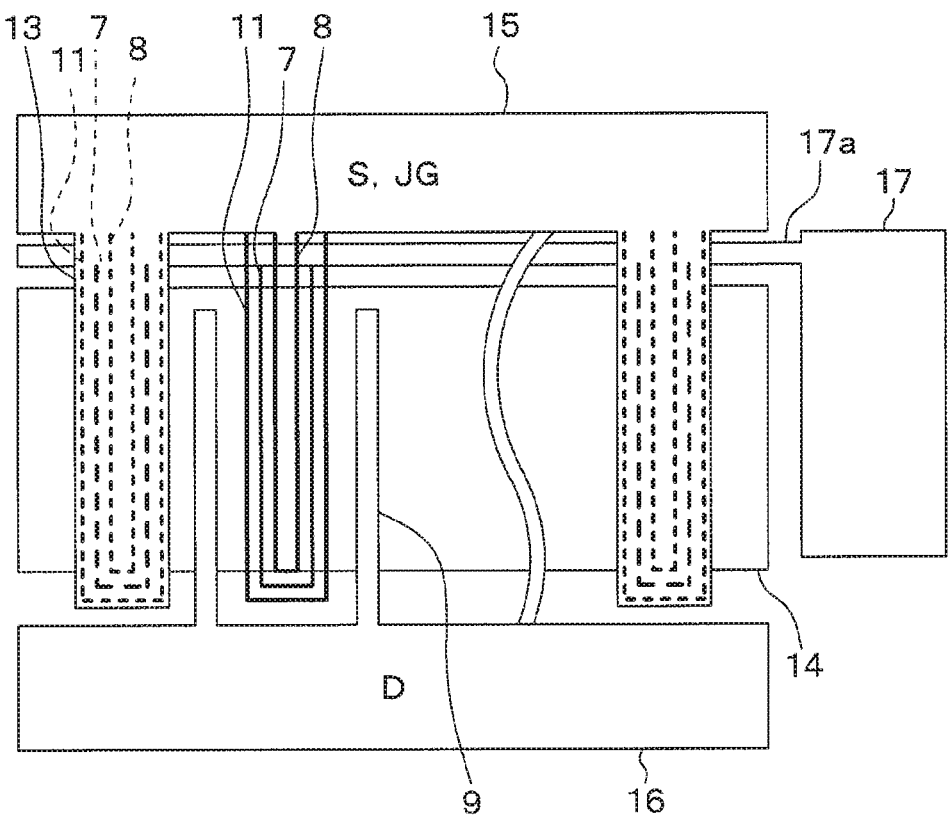
FIG. 2 is a top layout view of the semiconductor device shown in FIG. 1.

In the semiconductor device configured as above, as is shown in FIG. 2, a region where the switching device is formed is an active region 14. In FIG. 2, the electrode layer 13 second from the left is omitted and the MOS gate electrode 7, the source electrode 8, and the JG electrode 11 disposed below are shown in solid lines for ease of understanding of a layout of the respective portions.

As is shown in FIG. 2, in the present embodiment, the active region 14 is, for example, of a rectangular shape and multiple sets of two cells disposed oppositely in line symmetric arrangement are aligned along a longitudinal direction of the active region 14.

In each set, the two source electrodes 8 in the two cells are provided to extend parallel to each other. The MOS gate electrodes 7 are disposed on both sides with the two source electrodes 8 in between. The JG electrodes 11 are disposed on both sides with the source electrodes 8 and the MOS gate electrodes 7 in between. The drain electrodes 9 are formed with the source electrodes 8, the MOS gate electrodes 7, and the JG electrodes 11 in between. In FIG. 2, the source electrode 8 and the JG electrode 11 are shown separately. However, as is shown in FIG. 1, the both electrodes 8 and 11 are formed of the electrode layer 13 suspended above the MOS gate electrode 7 and are therefore formed integrally. The p-GaN layer 10, which is not shown in FIG. 2, has the same layout as the JG electrode 11, for example.

The electrode layer 13 is disposed at least in the active region 14. The source electrode 8 and the JG electrode 11 are coupled through the electrode layer 13 in the active region 14. By coupling the source electrode 8 and the JG electrode 11 in the active region 14 in the manner as above, impedance can be reduced as described above.

The respective electrodes 7-9, and 11 are provided to extend in a direction crossing the longitudinal direction of the active region 14 to an outside of the active region 14. The source electrode 8 and the JG electrode 11 are connected to a source pad 15 and the drain electrode 9 is connected to a drain pad 16. The MOS gate electrode 7 is connected to a gate pad 17 via a gate lead line 17a.

The two source electrodes 8 in each set are coupled on an opposite side to the source pad 15. The two MOS gate electrodes 7 in each set are also coupled on an opposite side to the gate lead line 17a. Likewise, the two JG electrodes 11 in each set are coupled on the opposite side to the source pad 15. Hence, the source electrodes 8 and the JG electrodes 11 are at substantially equipotential also in portions away from the source pad 15, and the MOS gate electrodes 7 are at substantially equipotential also in portions away from the gate lead line 17a.

An operation and an effect of the semiconductor device including the switching device of the present embodiment will now be described.

A switching device including both of the MOS gate electrodes 7 and the JG electrodes 11 as described above operates as a typical MOSFET due to the MOS gate electrodes 7 and operates as a JFET due to the JG electrodes 11. Hence, an equivalent circuit of the switching device shown in FIG. 1 is of a circuit configuration shown in FIG. 3.

Figure 3:
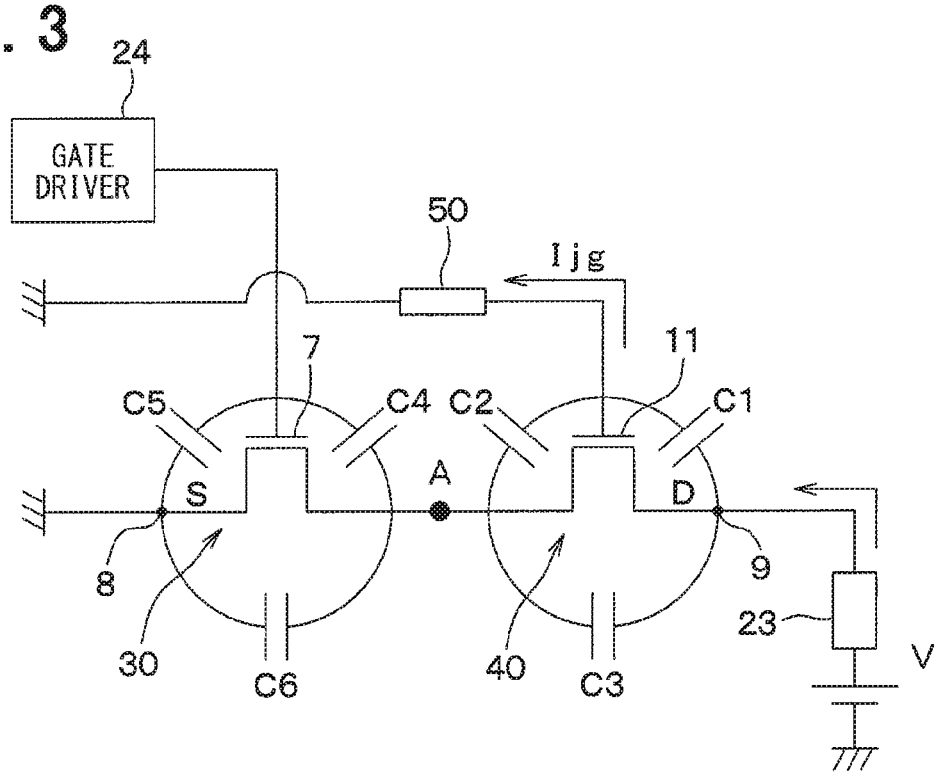
FIG. 3 is an equivalent circuit of a switching device shown in FIG. 1.

As is shown in FIG. 3, the switching device is connected to a load 23 and drives the load 23 as a gate driver 24 switches ON and OFF the switching device by controlling a gate voltage.

The switching device includes a normally-off MOSFET portion 30 formed of the MOS gate electrode 7 and a normally-on JFET portion 40 formed of the JG electrode 11 connected in series. An intermediate potential point A between the MOSFET portion 30 and the JFET portion 40 is, as is shown in FIG. 1, a portion at intermediate potential located below the JG electrode 11 in the surface portion of the u-GaN layer 2.

The JG electrode 11 is connected to the source electrode 8 and has same potential as the source electrode 8. Parasitic impedance 50 due to wiring is present between the two electrodes 11 and 8. However, because the two electrodes 11 and 8 are directly coupled through the electrode layer 13, a value of the parasitic impedance 50 is small. In the switching device configured as above, capacitances C1 through C3 are formed in the JFET portion 40, respectively, between the JG electrode 11 and the drain electrode 9, between the JG electrode 11 and the intermediate potential point A, and between the drain electrode 9 and the intermediate potential point A, and capacitances C4 through C6 are formed in the MOSFET portion 30, respectively, between the MOS gate electrode 7 and the intermediate potential point A, between the MOS gate electrode 7 and the source electrode 8, and between the intermediate potential point A and the source electrode 8.

The following will describe a turn-off operation of the switching device having the circuit configuration as above.

Figure 4:
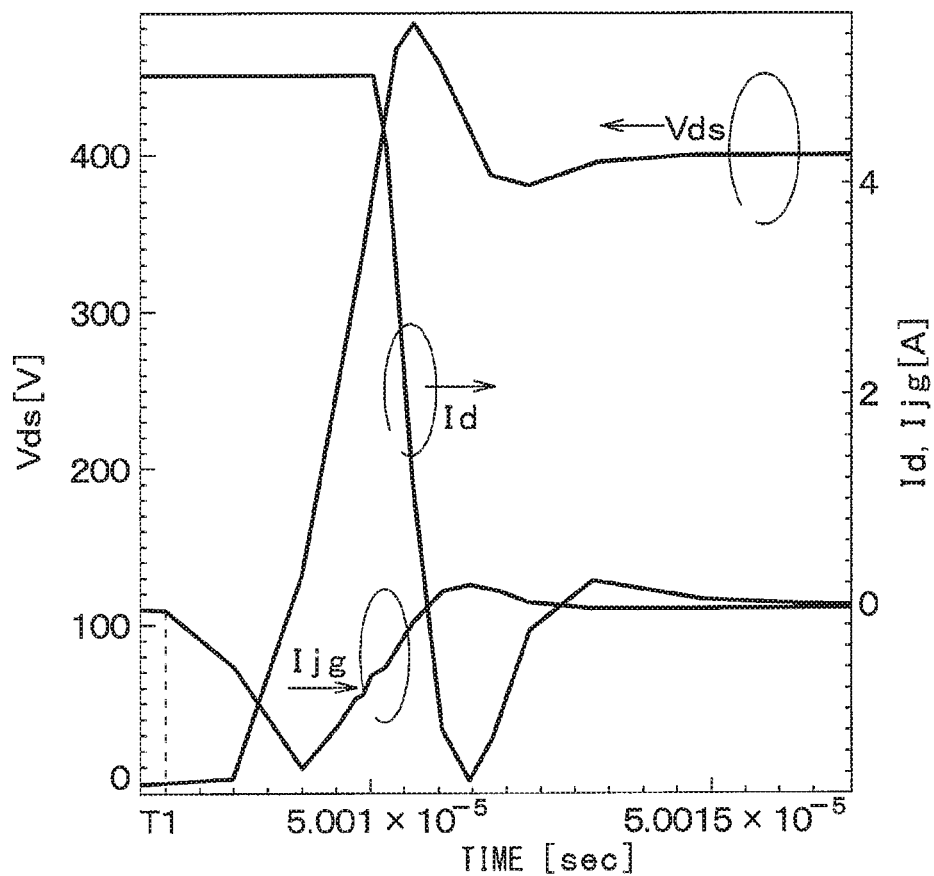
FIG. 4 is a chart showing variances in current value and voltage value in respective portions at turn-off.

FIG. 4 shows turn-off waveforms of the switching device in an H-bridge circuit having an induced load. Firstly, when application of a gate voltage to the MOS gate electrode 7 is stopped at a time T1 of FIG. 4, an off process of the MOSFET portion 30 starts and potential at the intermediate potential point A starts to rise, which is not shown in FIG. 4. An off process of the gate of a JFET starts when potential at the intermediate potential point A rises. That is, the feedback capacity C1 in the JFET is charged with a displacement current Ijg flowing a path from the drain electrode 9 to a ground by way of the JG electrode 11.

As the feedback capacitance C1 is charged, potential Vds of the drain electrode 9 rises while a drain current Id decreases. When potential at the intermediate potential point A rises above a threshold voltage of the JFET portion 40, the JFET portion 40 turns off. The entire switching device is thus turned off.

To accelerate such a turn-off operation, it is necessary to charge the feedback capacitance C1 at a high speed. To charge the feedback capacitance C1 at a high speed, it is important to reduce impedance between the JG electrode 11 and the source electrode 8 and to reduce the feedback capacitance C1.

It should be noted that the JG electrode 11 and the source electrode 8 are coupled directly through the electrode layer 13 in the present embodiment. Owing to the configuration as above, a resistance value of the parasitic impedance 50 due to an interconnection resistance between the two electrodes 11 and 8 can be maintained small. Hence, the impedance between the JG electrode 11 and the source electrode 8 can be reduced.

In the present embodiment, a forming area of the p-GaN layer 10 is reduced to the least extent possible in the laminated structure of the u-GaN layer 4 and the p-GaN layer 10 by disposing the laminated structure away from the drain electrode 9. Owing to the configuration as above, the feedback capacitance C1 formed between the p-GaN layer 10 and the surface portion of the u-AlGaN layer 3 can be reduced. The end face of the p-GaN layer 10 facing the drain electrode 9 is flush with the end face of the u-GaN layer 4 facing the drain electrode 9 or closer to the MOS gate electrode 7 than the end face of the u-GaN layer 4 facing the drain electrode 9. Owing to the configuration as above, a breakdown voltage can be secured, which will be described in the following with reference to FIG. 5 through FIG. 8.

The feedback capacitance C1 may be reduced by reducing an opposing area of the p-GaN layer 10 and the u-AlGaN layer 3. An area of the p-GaN layer 10 is reduced to the least extent possible most effectively by aligning the end face of the p-GaN layer 10 facing the drain electrode 9 flush with the end face of the u-GaN layer 4 facing the drain electrode 9.

However, when the end faces of the p-GaN layer 10 and the u-AlGaN layer 3 facing the drain electrode 9 are aligned flush with each other, a decrease in breakdown voltage due to field concentration is confirmed.

Figure 5:
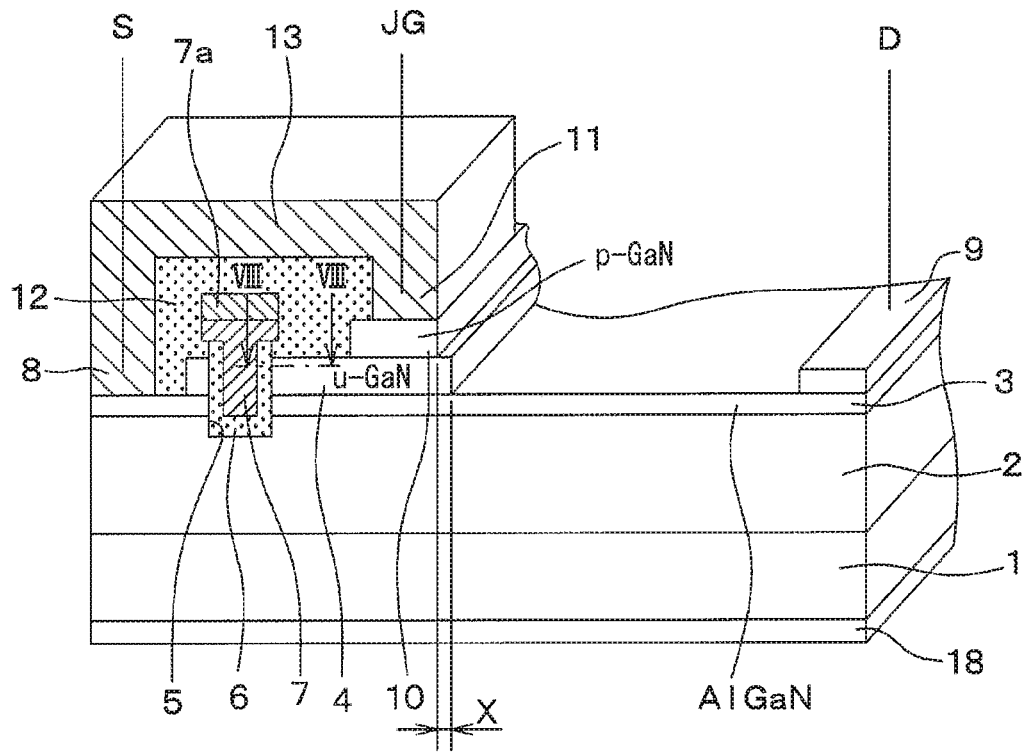
FIG. 5 is a view showing a distance X in the semiconductor device shown in FIG. 1.
Figure 6:
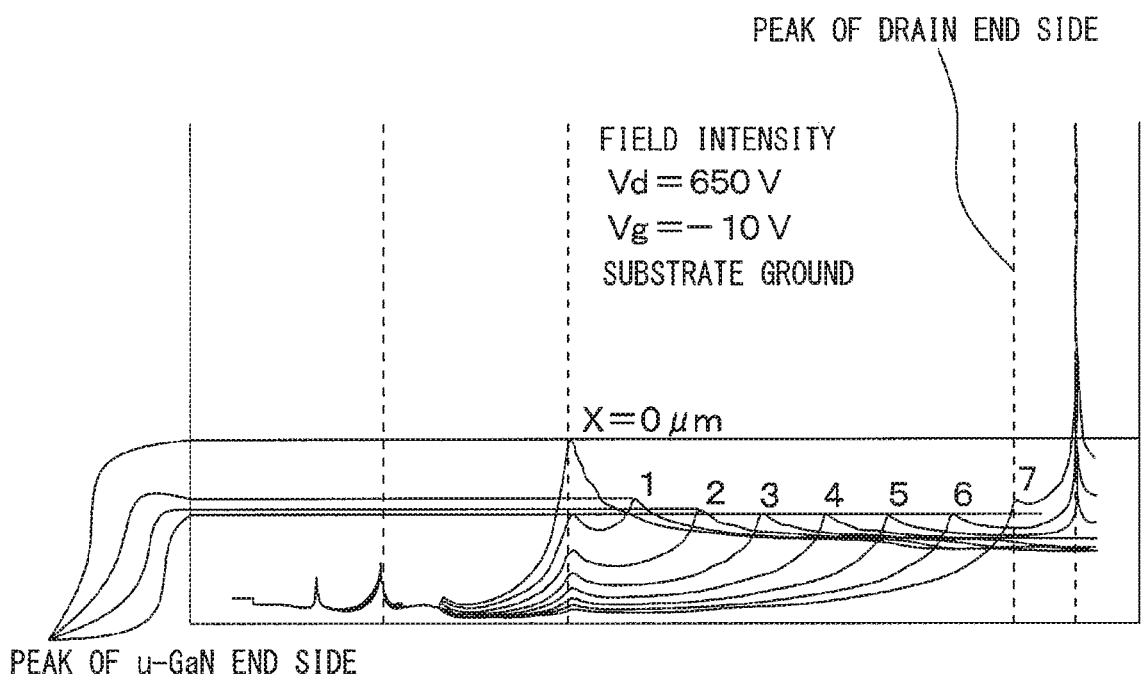
FIG. 6 is a chart showing a field intensity distribution when a simulation is run by changing the distance X.

More specifically, as is shown in FIG. 5, X is set as a distance from the end face of the p-GaN layer 10 facing the drain electrode 9 to the end face of the u-GaN layer 4 facing the drain electrode 9, that is, a protruding amount of the u-GaN layer 4 from the p-GaN layer 10. A field intensity distribution is checked by changing the distance X. Herein, a simulation is run by setting a distance from the p-GaN layer 10 to the drain electrode 9 to 8 μm and by changing the distance X from 0 to 7 μm. A field intensity distribution set forth in FIG. 6 is obtained as a result. Peak positions of field intensity in FIG. 6 are a position of an end of the u-GaN layer 4 facing the drain electrode 9 (hereinafter, referred to as a u-GaN end) and an end of the drain electrode 9 facing the u-GaN layer 4 (hereinafter, referred to as a drain end). Field intensities at the u-GaN end and at the drain end are plotted against the distance X, a result of which is set forth in FIG. 7.

Figure 7:
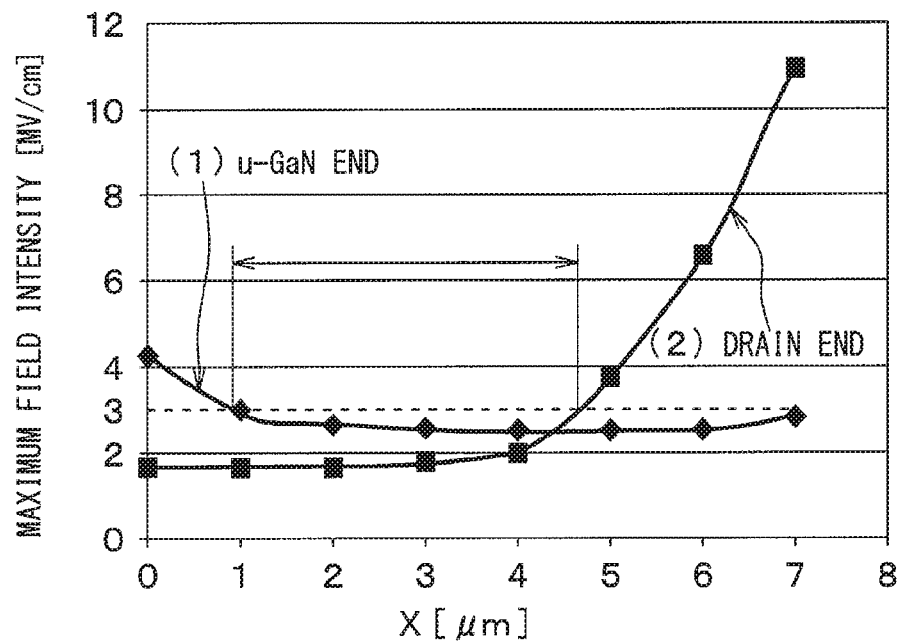
FIG. 7 is a plot chart of variances in field intensity with the distance X.

As are shown in FIG. 6 and FIG. 7, when the end face of the p-GaN layer 10 facing the drain electrode 9 is aligned flush with the end face of the u-GaN layer 4 facing the drain electrode 9, field intensity at the u-GaN end rises abruptly in comparison with a case where the distance X is set to 1 μm or longer due to a reason as follows. That is, in a case where the distance X is 1 μm or longer, a space charge amount from the drain electrode 9 to the JG electrode 11 varies abruptly in a blocking state and an intense electric field is generated where a variance is significant. More specifically, positive charges are present from the drain electrode 9 to the u-GaN layer 4 due to polarization whereas no charge is present from the u-GaN layer 4 to the p-GaN layer 10 because positive charges and negative charges due to polarization cancel each other out. Also, negative charges are present in a portion closer to the source electrode 8 than the p-GaN layer 10 due to depletion in the p-GaN layer 10 and a space charge amount varies gradually. When the distance X becomes shorter than 1 μm, a zero space charge region becomes narrower or disappears as the u-GaN layer 4 is aligned flush with or nearly flush with the p-GaN layer 10. Hence, positive charges turn to negative charges abruptly over a short distance. A study conducted by the inventors reveals that field intensity at the u-GaN end can be lowered by adjusting the distance X for the end of the u-GaN layer 4 facing the drain electrode 9 to protrude from the end of the p-GaN layer 10 facing the drain electrode 9, to be more specific, by setting the distance X to at least 1 μm or longer.

Meanwhile, field intensity at the drain end rises as a distance to the u-GaN layer 4 becomes shorter due to field concentration taking place under influence of the decreasing distance. To be more specific, the result reveals that maximum field intensity rises abruptly when the distance X becomes longer than 5 μm.

Low maximum field intensity is preferable in consideration of a breakdown voltage of the switching device. The maximum field intensity may be lowered by setting the distance X to 4.5 μm or shorter. As is set forth in FIG. 7, it is more preferable to set the distance X to a range of 1 μm to 4 μm both inclusive for a design to obtain a stable breakdown voltage.

Hence, by setting the distance X to a range of 1 μm to 4.5 μm both inclusive, the maximum field intensity can be lowered while the feedback capacitance C1 is maintained small. A breakdown voltage of the switching device basically depends on an interval from the end face of the u-GaN layer 10 to the drain electrode 9, and the breakdown voltage becomes higher as the interval increases. By contrast, a range of the distance X within which the maximum field intensity can be lowered remains same, that is, remains in the range of 1 μm to 4.5 μm both inclusive as specified above independently of an interval from the end face of the u-GaN layer 10 to the drain electrode 9. Hence, even when an interval from the end face of the u-GaN layer 10 to the drain electrode 9 varies, the effect described above can be obtained by setting the distance X to the range of 1 μm to 4.5 μm or more preferably 4 μm both inclusive.

Figure 8:
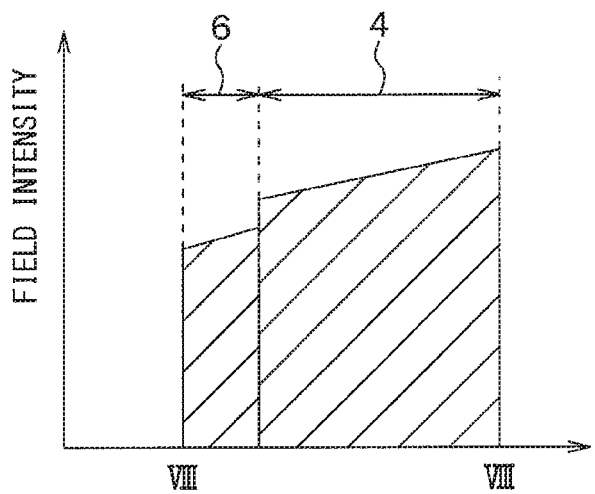
FIG. 8 is a chart showing a field intensity distribution on the line VIII-VIII of FIG. 5.

In the present embodiment, the MOS gate electrode 7 is provided to penetrate through the u-GaN layer 4. That is, the u-GaN layer 4 is provided to be in contact with the gate structure portion including the MOS gate electrode 7. When the structure as above is adopted, a field intensity distribution in the gate insulating film 6 and the u-GaN layer 4, for example, on the line VIII-VIII of FIG. 5 is a distribution as shown in FIG. 8, and field intensity becomes weaker toward the MOS gate structure due to a reason as follows. That is, charges are balanced in a neutral state by the u-GaN layer 4. However, because negative charges are supplied from the conductive substrate, charges become negatively charged as a whole.

In the manner as above, field intensity in the u-GaN layer 4 becomes weaker toward the MOS gate electrode 7. Hence, field intensity in the gate insulating film 6 becomes weaker, which can in turn enhance reliability.

As has been described above, the JG electrode 11 and the source electrode 8 are directly coupled through the electrode layer 13 in the present embodiment. Owing to the configuration as above, a resistance value of the parasitic impedance 50 can be smaller, which can in turn reduce impedance between the JG electrode 11 and the source electrode 8. Also, an opposing area of the u-GaN layer 4 and the 2DEG is reduced to the least extent possible by disposing the u-GaN layer 4 and the p-GaN layer 10 away from the drain electrode 9. Hence, the feedback capacitance C1 can be reduced, too.

By reducing resistance and inductance between the JG electrode 11 and the source electrode 8 and reducing the feedback capacitance C1 as above, the feedback capacitance C1 can be charged at a high speed and hence the JFET portion 40 can be turned off at a high speed. Consequently, turn-off of the switching device can be accelerated further. The switching device thus becomes capable of switching at a higher speed.

The effect as above can be obtained at least by setting the distance X to a range of 0 μm to 5 μm both inclusive. However, the distance X is set to allow the end of the u-GaN layer 4 to protrude toward the drain electrode 9 from the p-GaN layer 10, that is, the distance X is set to a range of 1 μm to 5 μm both inclusive. Owing to the configuration as above, maximum field intensity can be lowered and hence the semiconductor device has a higher breakdown voltage.

The MOS gate electrode 7 is provided to penetrate through the u-GaN layer 4. Hence, field intensity in the u-GaN layer 4 becomes weaker toward the MOS gate electrode 7 and hence field intensity in the gate insulating film 6 becomes weaker. Consequently, reliability is enhanced.

Second Embodiment

A second embodiment will now be described. The present embodiment is same as the first embodiment above except that a gate structure portion is changed from the gate structure portion of the first embodiment above, and only a difference from the first embodiment above will be described.

Figure 9:
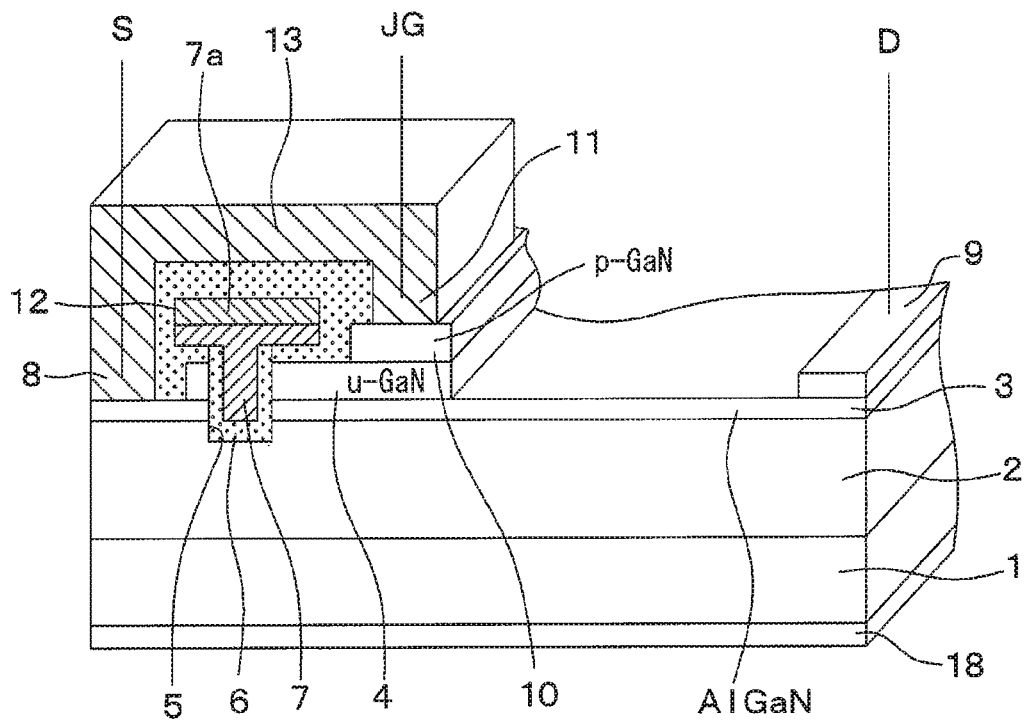
FIG. 9 is a sectional perspective view of a semiconductor device according to a second embodiment.

As shown in FIG. 9, in the present embodiment, a MOS gate electrode 7 is of a T shape to reduce resistance of the MOS gate electrode 7 in a gate structure portion. That is, the MOS gate electrode 7 is of a T gate structure in which an upper part of the MOS gate electrode 7 is made wider than a lower part in a direction in which a current flows between a source and a drain. In other words, the MOS gate electrode 7 is provided to extend to an outside of a recess portion 5 so as to protrude toward a source electrode 8 and a drain electrode 9 from the recess portion 5 in a portion outside the recess portion 5. As with the MOS gate electrode 7, a metal layer 7a provided on a surface portion of the MOS gate electrode 7 is also provided to extend so as to protrude toward the source electrode 8 and the drain electrode 9 from the recess portion 5.

Owing to the configuration as above, a sectional area of a current flow can be increased. That is, a current flows in a direction perpendicular to a sheet surface of FIG. 9 in the MOS gate electrode 7. Hence, an area of a cross section normal to a direction perpendicular to the sheet surface, that is, a sectional area of a current flow can be increased. Consequently, resistance of the MOS gate electrode 7 can be reduced, which can in turn accelerate switching.

Third Embodiment

A third embodiment will now be described. The present embodiment is same as the first embodiment above except that a pad layout is changed from the pad layout of the first embodiment above, and only a difference from the first embodiment above will be described.

Figure 10:
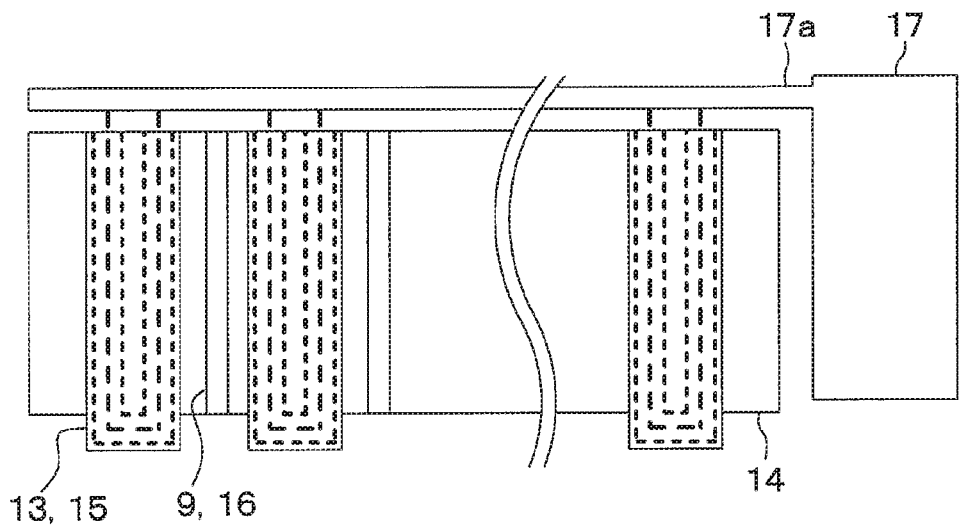
FIG. 10 is a top layout view of a semiconductor device according to a third embodiment.

As shown in FIG. 10, in the present embodiment, a source pad 15 and a drain pad 16 are disposed in an active region 14. The source pad 15 is formed by securing a large area for an electrode layer 13 which couples a source electrode 8 and a JG electrode 11. In the present embodiment, a large area is secured by connecting the electrode layer 13 from one cell to an adjacent cell.

By disposing the source pad 15 in the active region 14 as above, a length of wiring from the source electrode 8 and the JG electrode 11 to the source pad 15 can be shorter and interconnection resistance can be lower. Hence, impedance can be reduced further. A switching device thus becomes capable of switching at a further higher speed.

Likewise, by providing the drain pad 16 in the active region 14, a length of wiring from the drain electrode 9 to the drain pad 16 can be shorter and interconnection resistance can be lower, too.

A desirable voltage may be applied to respective portions from a gate pad 17, the source pad 15, and the drain pad 16 disposed as above by establishing an electrical connection to an outside by, for example, bonding wires. However, a bump connecting structure as are shown in FIG. 11A and FIG. 11B is also available.

More specifically, an electrode connecting substrate 20 provided with an unillustrated desirable circuit pattern and electrode portions 21 to be connected to desirable regions in the circuit pattern is prepared. The electrode portions 21 are faced to a semiconductor device and the gate pad 17, the source pad 15 and the drain pad 16 are connected to the corresponding electrode portions 21 with conductor bumps 22 made of solder or the like. A connecting structure configured as above is capable of establishing multiple electrical connections between the circuit pattern provided to the electrode connecting substrate 20 and a MOS gate electrode 7, a JIG electrode 11, a source electrode 8, and a drain electrode 9 at a time.

Figure 11A:
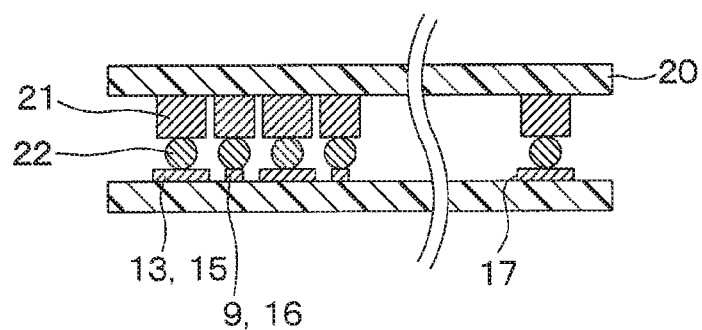
FIG. 11A is a sectional view showing an example of a bump connecting structure in the semiconductor device shown in FIG. 10.
Figure 11B:
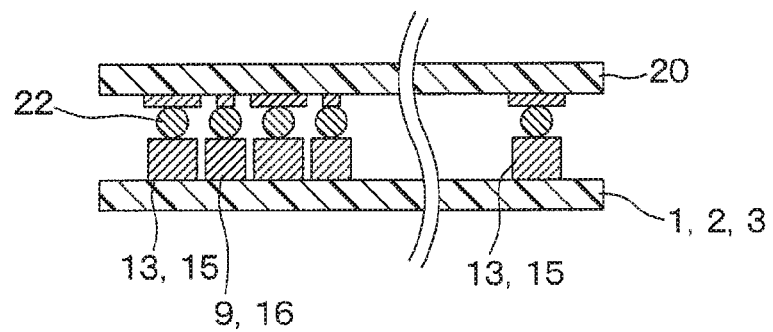
FIG. 11B is a sectional view showing another example of the bump connecting structure in the semiconductor device shown in FIG. 10.

In FIG. 11A, the electrode portions 21 are thick membrane electrodes thicker than the gate pad 17, the source pad 15, and the drain pad 16. Conversely, in FIG. 11B, the gate pad 17, the source pad 15, and the drain pad 16 are thick membrane electrodes thicker than the electrode portions 21. Either structure is applicable. Alternatively, the electrode portions 21, the gate pad 17, the source pad 15, and the drain pad 16 may have a same thickness.

Fourth Embodiment

A fourth embodiment will now be described. The present embodiment is same as the third embodiment above except that a pad layout is changed from the pad layout of the third embodiment above, and only a difference from the first embodiment above will be described.

Figure 12:
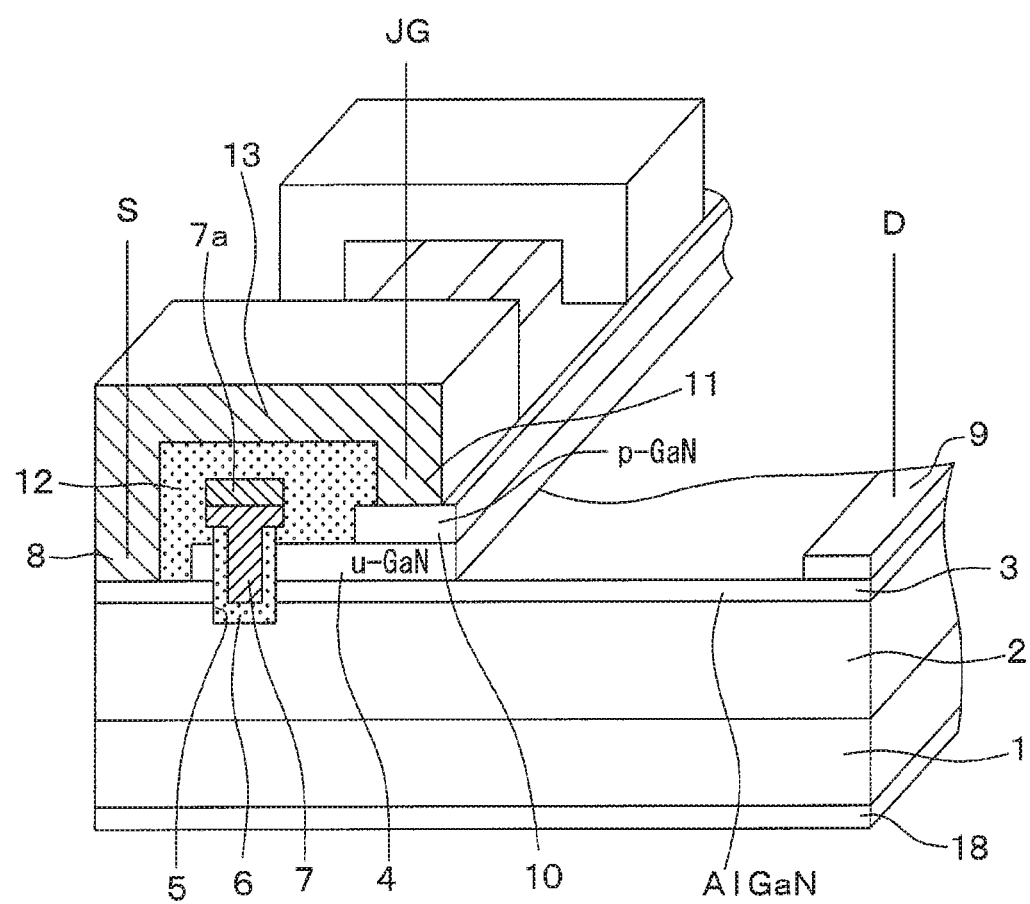
FIG. 12 is a sectional perspective view of a semiconductor device according to a fourth embodiment.

As is shown in FIG. 12, in the present embodiment, an electrode layer 13 coupling a source electrode 8 and a JG electrode 11 is of a ladder shape. More specifically, the electrode layer 13 is formed in a ladder shape by being divided into multiple sections in an extending direction of a MOS gate electrode 7 or by providing multiple openings to the electrode layer 13 in the extending direction of the MOS gate electrode 7. The electrode layer 13 of a structure shown in FIG. 12 can be formed by, for example, depositing an electrode material forming the electrode layer 13 and by patterning the deposited film by etching into a ladder shape.

Figure 13:
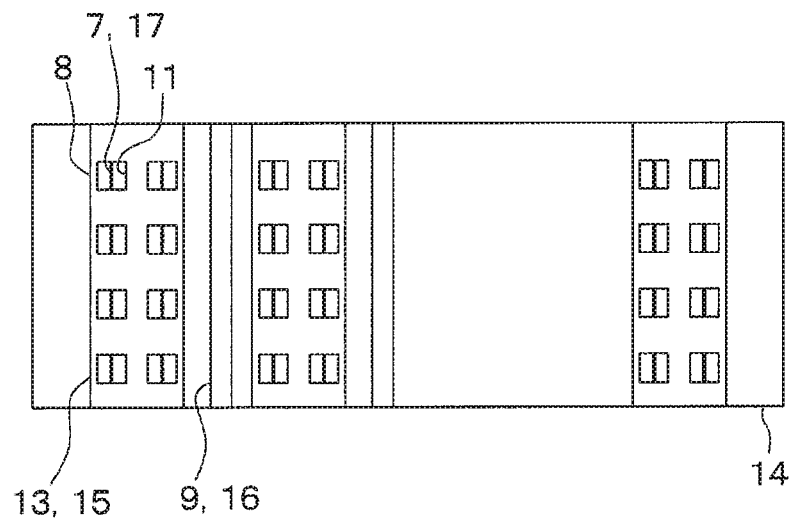
FIG. 13 is a top layout view of the semiconductor device according to the fourth embodiment.

When the structure as above is adopted, as is shown in FIG. 13, the electrode layer 13 is not provided on a gate structure portion in some portions of an active region 14, and such portions may be used as a gate pad 17. Such portions other than the portions used as the gate pad 17 may be used as a source pad 15 by coupling the source electrode 8, the JG electrode 11, and the electrode layer 13.

Owing to the structure as above, a length of wiring from the MOS gate electrode 7 to the gate pad 17 can be shorter and hence interconnection resistance can be lower.

Figure 14:
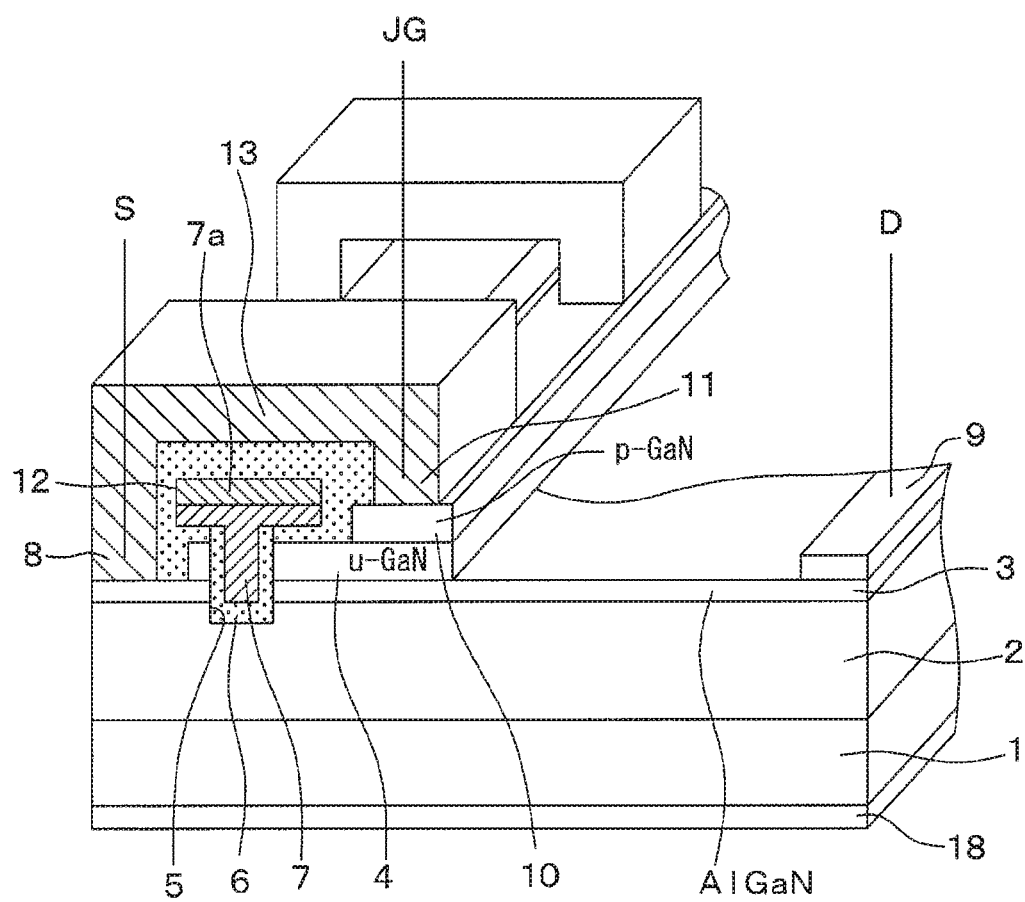
FIG. 14 is a sectional perspective view of a semiconductor device as a modification of the fourth embodiment.

Even when the electrode layer 13 is divided to multiple sections and the gate pad 17 is disposed between the divided sections as the structure described above, as is shown in FIG. 14, the MOS gate electrode 7 may be formed into a T shape as in the second embodiment above, in which case, an effect same as the effect obtained in the second embodiment above can be also obtained.

Fifth Embodiment

A fifth embodiment will now be described. The present embodiment is same as the first embodiment above except that a u-GaN layer 4 is disposed differently from the first embodiment above, and only a difference from the first embodiment above will be described.

Figure 15:
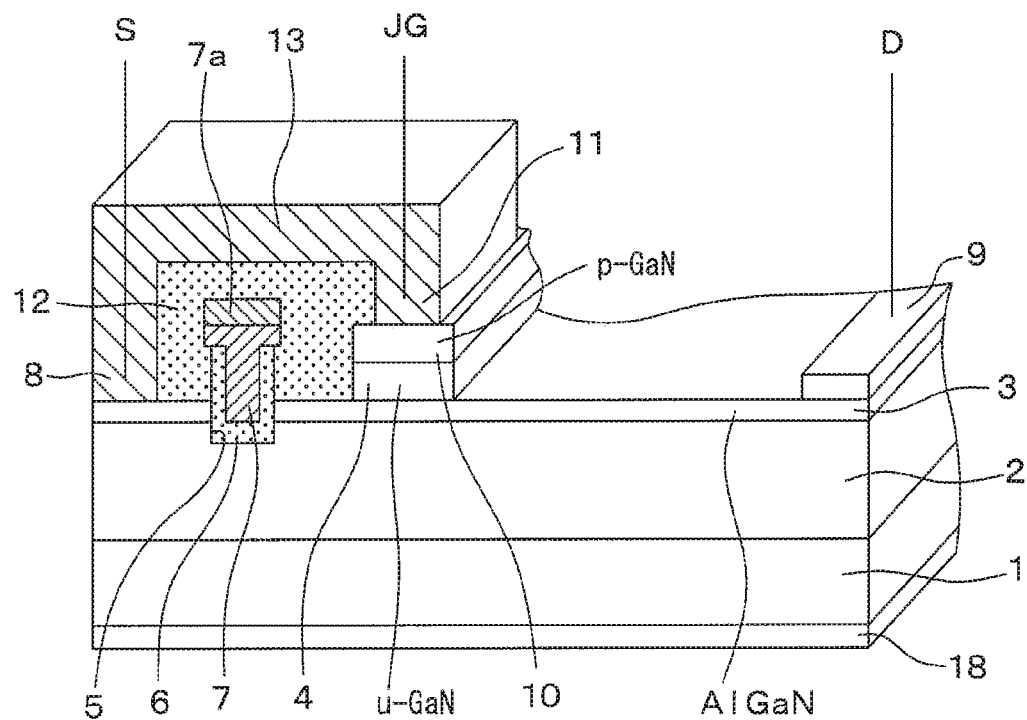
FIG. 15 is a sectional perspective view of a semiconductor device according to a fifth embodiment.

As is shown in FIG. 15, in the present embodiment, a u-GaN layer 4 is disposed away from a gate structure portion and disposed only between the gate structure portion and a drain electrode 9.

By disposing the u-GaN layer 4 away from the gate structure portion as above, a 2DEG is increased by reducing an area of the u-GaN layer 4. Hence, ON resistance Ron can be reduced.

Figure 16:
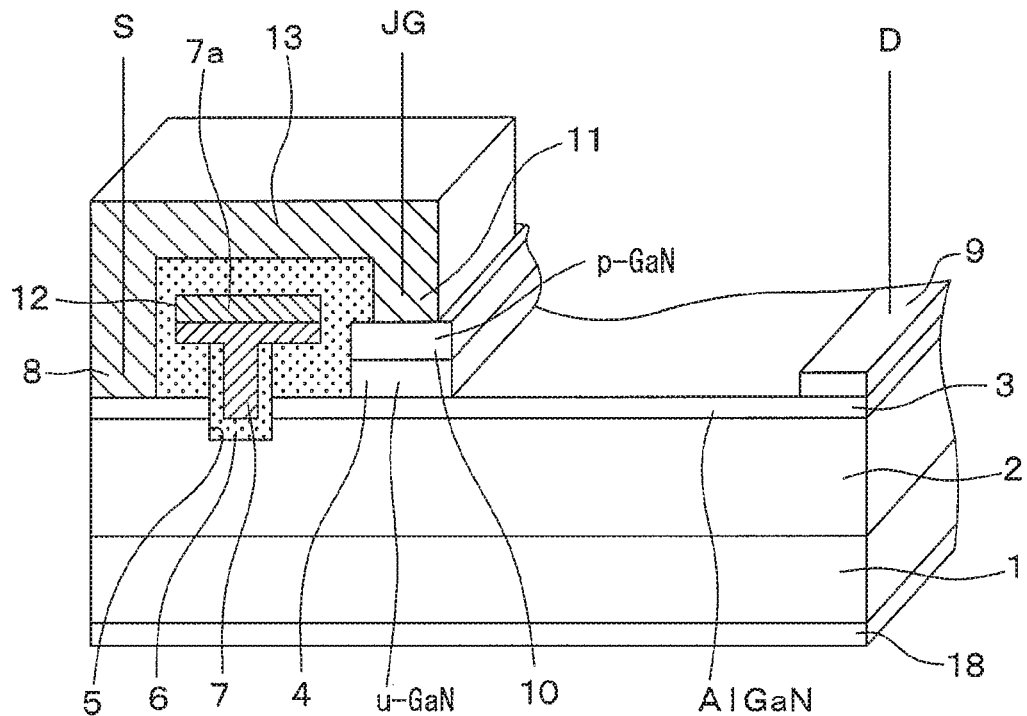
FIG. 16 is a sectional perspective view of a semiconductor device as a modification of the fifth embodiment.
Figure 17:
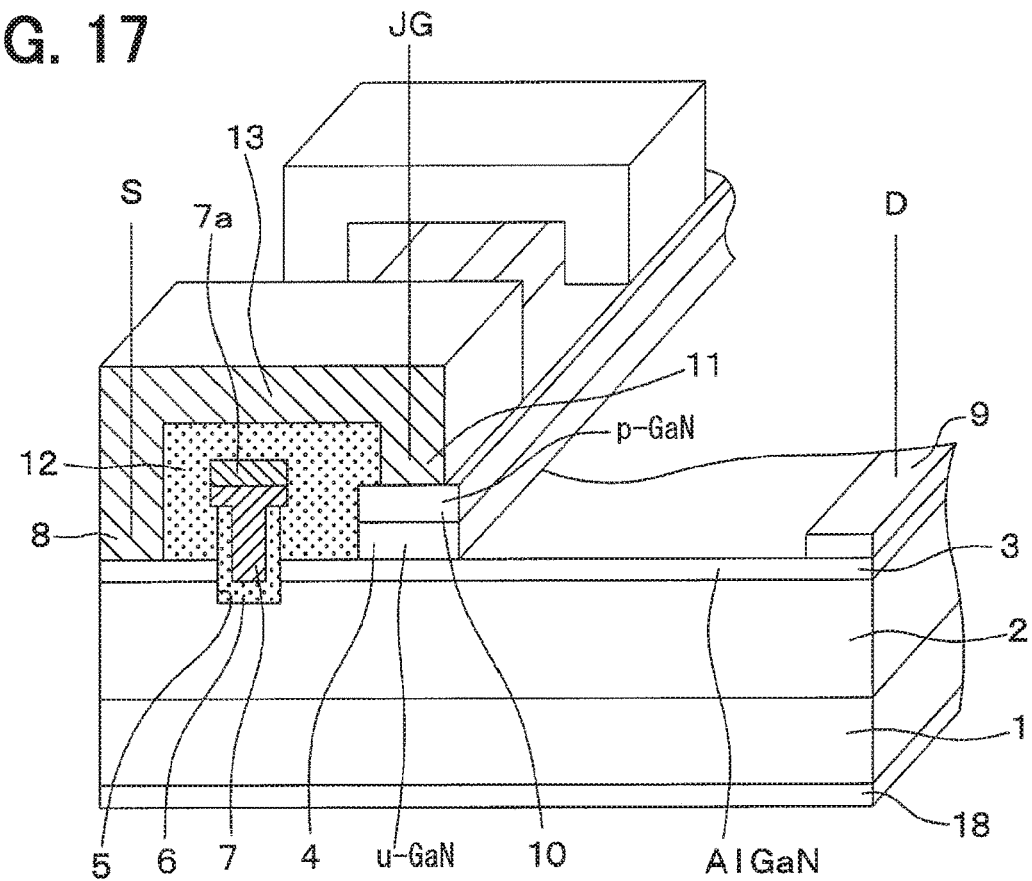
FIG. 17 is a sectional perspective view of a semiconductor device as another modification of the fifth embodiment.
Figure 18:
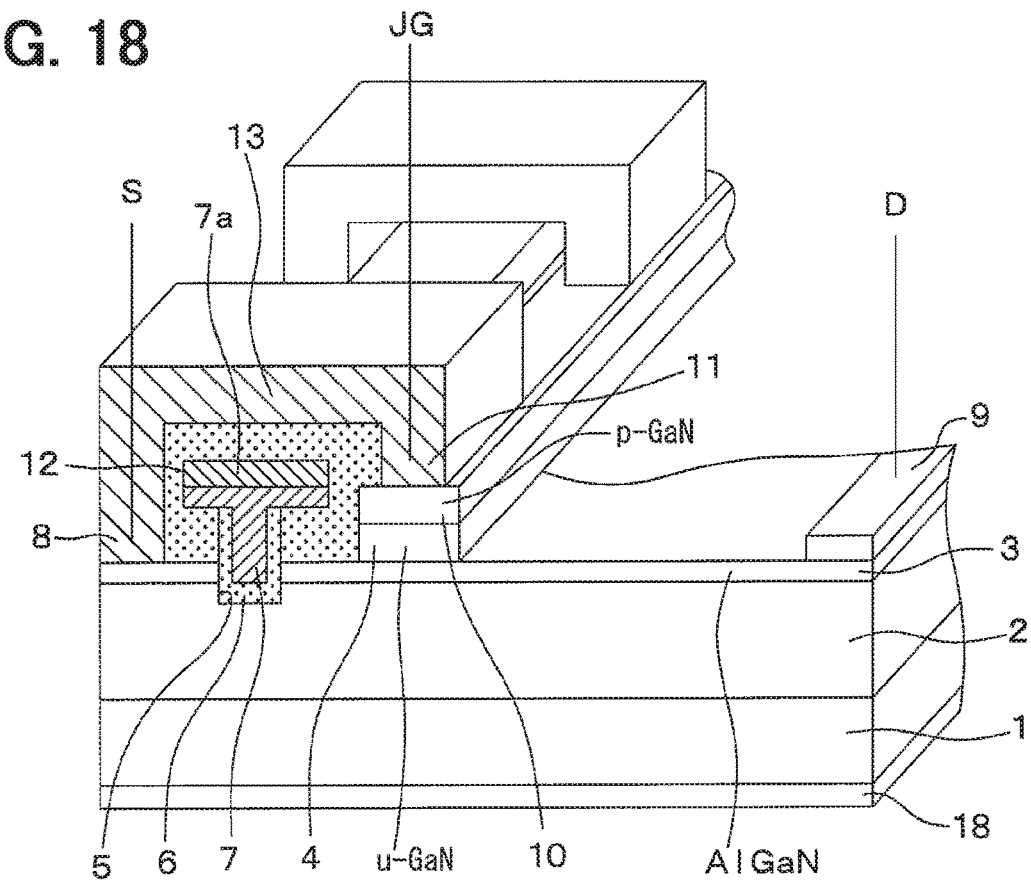
FIG. 18 is a sectional perspective view of a semiconductor device as still another modification of the fifth embodiment.

FIG. 15 shows a case where a location of the u-GaN layer 4 is changed in the structure of the first embodiment above. However, the structure of the present embodiment is also applicable to any one of the embodiments described above. For example, as is shown in FIG. 16, the u-GaN layer 4 can be disposed away from the gate structure portion in a structure in which a MOS gate electrode 7 is formed in a T shape as in the second embodiment above. Also, as is shown in FIG. 17, the u-GaN layer 4 can be disposed away from the gate structure portion in a structure in which an electrode layer 13 is divided into multiple sections as in the fourth embodiment above. In such a case, too, as is shown in FIG. 18, the MOS gate electrode 7 can be formed in a T shape as in the second embodiment above.

Sixth Embodiment

A sixth embodiment will now be described. The present invention is same as any one of the first through fifth embodiments above except that a JG-S resistance value is defined in any one of the first through fifth embodiments above and only a difference from the first through fifth embodiments will be described. The following will describe a case where a semiconductor device adopts the configuration of the first embodiment above and it should be understood that the same applies to a case where the semiconductor device adopts the configuration of any one of the second through fifth embodiments above.

For a semiconductor device having a lateral switching device of the configuration of any one of the first through fifth embodiments above, it is important to enhance reliability by reducing damage and deterioration of a gate insulating film 6. Damage of the gate insulating film 6 can be reduced by making a maximum voltage value at an intermediate potential point A at turn-off small. From an assiduous study conducted by the inventors on the maximum voltage value at the intermediate potential point A at turn-off, it is confirmed that the maximum voltage value depends on a JG-S resistance value.

Figure 19:
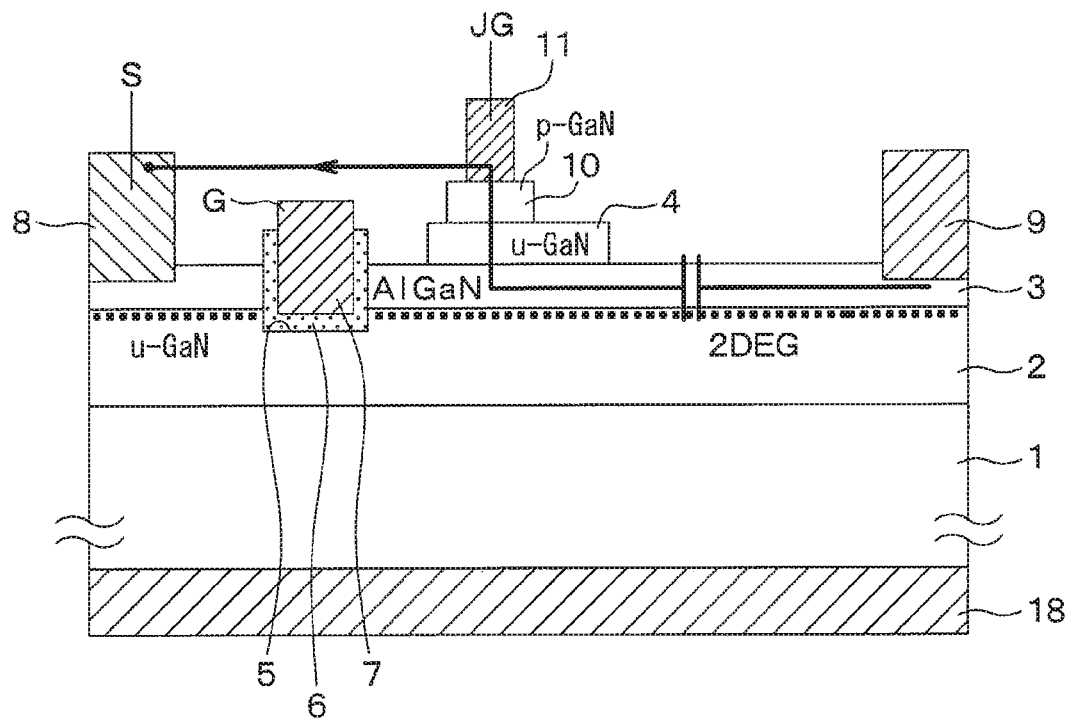
FIG. 19 is a view showing a current path in the switching device at turn-off.

A JG-S resistance value will be described. As is shown in FIG. 19, a current flowing from a drain at turn-off flows to a source through a capacitor formed by sandwiching an AlGaN layer 3 between a drain electrode 9 and a u-GaN layer 4 both of which are assumed to be electrodes. The JG-S resistance value means a total of resistance components in a current path where a current flows through a JG electrode 11 and a source electrode 8 at turn-off.

That is, a current flowing from the drain takes a current path from the u-GaN layer 4 or a p-GaN layer 10 to the source electrode 8 by way of the JG electrode 11. A total of resistance components in the current path is referred to as a JG-S resistance value. More specifically, resistance components in the current passing path are internal resistance Ru of the u-GaN layer 4, internal resistance Rp of the p-GaN layer 10, contact resistance Rpjg between the p-GaN layer 10 and the JG electrode 11, and electrode resistance Rm from the JG electrode 11 to the source electrode 8. Hence, a JG-S resistance Rjgs is expressed by Equation (1) as follows.

$$Rjgs = Ru + Rp + Rpjg + Rm \quad (1)$$

As in the first through fifth embodiments above, the JG electrode 11 and the source electrode 8 are coupled and the both electrodes 11 and 8 are made of metal having a small resistance value. Accordingly, the electrode resistance Rm is negligibly small. Equation (1) above can be thus rewritten simply as Equation (2) as follows.

$$Rjgs = Ru + Rp + Rpjg \quad (2)$$

At turn-off, a current flows in the u-GaN layer 4 and the p-GaN layer 10 in a longitudinal direction, that is, in a normal direction to a substrate 1. The p-GaN layer 10 is as thin as, for example, 100 nm or less and heavily doped with an impurity, such as Mg. Hence, the internal resistance Rp of the p-GaN layer 10 becomes sufficiently smaller than the contact resistance Rpjg between the p-GaN layer 10 and the JG electrode 11. Further, the u-GaN layer 4 is thin and in contact with the p-GaN layer 10. Hence a resistance value decreases as holes diffuse from the p-GaN layer 10, and the internal resistance Rp of the u-GaN layer 4 also becomes sufficiently smaller than the contact resistance Rpjg between the p-GaN layer 10 and the JG electrode 11. Equation (2) above can be thus rewritten simply as Equation (3) as follows.

$$Rjgs \approx Rpjg$$

Hence, the JG-S resistance value basically means a resistance value expressed by Equation (1) above and, in a simple form, is represented by the contact resistance Rpjg between the p-GaN layer 10 and the JG electrode 11 as expressed by Equation (3) above.

Figure 20:
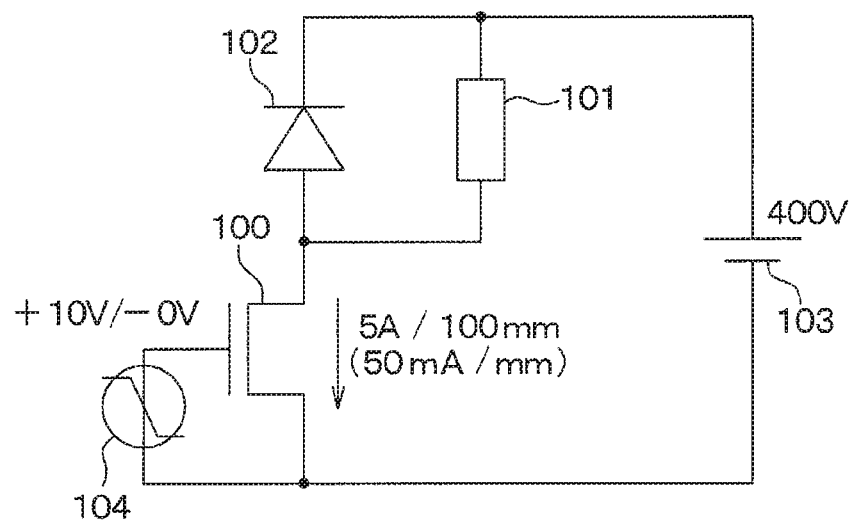
FIG. 20 is a circuit diagram of a calculated structure used in a simulation.

A simulation is run on the maximum voltage value at the intermediate potential point A at turn-off according to a circuit of a calculated structure shown in FIG. 20. More specifically, an induced load 101 is disposed in a source-drain current path in a switching device 100 and a freewheel diode 102 is connected to the induced load 101 in parallel to supply power from, for example, a 400-V power supply 103. By controlling a gate voltage of the switching device 100 by a gate drive portion 104, a voltage of +10 V being applied as a gate voltage is cancelled and reduced to 0 V. A drain current of 50 mA is thus allowed to flow by assuming that a channel width of the switching device 100 is 100 mm.

Figure 21:
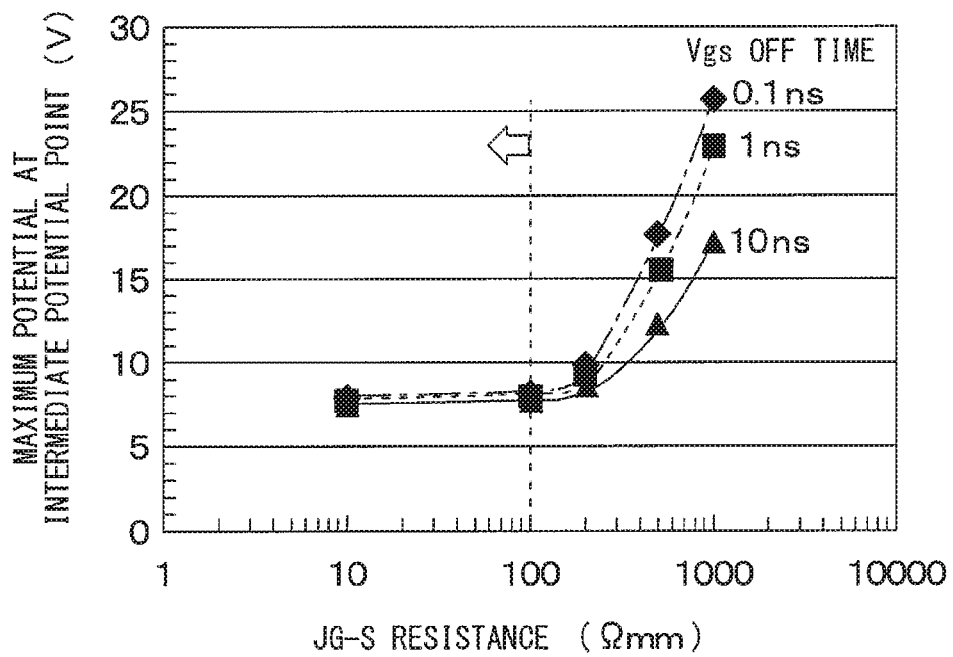
FIG. 21 is a chart showing a result of the simulation run on a relationship between a JG-S resistance value and a maximum voltage value at an intermediate potential point.

From the simulation run as above, it is confirmed that the maximum voltage value at the intermediate potential point A converges to substantially a constant value when the JG-S resistance value reaches a predetermined value while a gate voltage Vgs is off, in other words, without depending on a gate voltage breaking speed dV/dt. More specifically, as is shown in FIG. 21, the maximum voltage value at the intermediate potential point A remains substantially at a constant value at or below 10 V when the JG-S resistance value decreases to 200 Ωmm or below. The maximum voltage value remains substantially constant at about 8 V when the JG-S resistance value further decreases to 100 Ωmm or below.

Criticality is thus confirmed between the JG-S resistance value and the maximum voltage value at the intermediate potential point A at turn-off. The criticality does not depend on a gate voltage breaking speed dV/dt and, due to the criticality, the maximum voltage value at the intermediate potential point A takes a minimum value when the JG-S resistance value is 200 Ωmm or less, more preferably 100 Ωmm or less. In the simulation, the drain current is 5 A as an example. However, a result shows a similar tendency even when a current value is different. That is, the criticality does not depend on a drain current, either, and depends on the JG-S resistance value alone.

Hence, by setting the JG-S resistance value to 200 Ωmm or less, more preferably 100 Ωmm or less, the maximum voltage at the intermediate potential point A at turn-off can be made small and can be prevented from becoming larger than the maximum voltage in a DC OFF state. Hence, an increase in field intensity applied on the gate insulating film 6 can be limited, which can in turn reduce damage on the gate insulating film 6. Consequently, reliability of the gate insulating film 6 can be enhanced. Breaking which causes the switching device to yield triggered by a damage on the gate insulating film 6 can be thus prevented.

The effect as above can be obtained when the JG-S resistance value, that is, a total of the resistance components expressed by Equation (1) above is 200 Ωmm or less, more preferably 100 Ωmm or less. In a case where the JG-S resistance value is represented by the contact resistance Rpjg between the p-GaN layer 10 and the JG electrode 11 as expressed by Equation (3) above, the effect as above can be obtained when the contact resistance Rpjg is at least 200 Ωmm or less.

Other Embodiments

The present disclosure has been described according to the embodiments. It should be appreciated, however, that the present disclosure is not limited to the embodiments above and includes various modifications and alterations within the equivalent scope. In addition, various combinations and embodiments, as well as other combinations further including one element alone and more or less than one element are also within the scope and the idea of the present disclosure.

For example, in the respective embodiments above, the recess portion 5 is of a depth with which the surface layer of the u-GaN layer 2 is removed partially, which is, however, a mere example. For example, the recess portion 5 may be of a depth with which the surface of the u-GaN layer 2 is exposed or a part of the u-AlGaN layer 3 remains to an extent that no 2DEG carrier is formed at the bottom of the recess portion 5.

The top layouts of the switching devices of the respective embodiments shown in FIG. 2 and so on are mere examples and can be changed as needed.

The respective embodiments have described a case where the first and second GaN-based semiconductor layers forming a channel forming layer are formed of the u-GaN layer 2 and the u-AlGaN layer 3, respectively, which is, however, a mere example. Other materials are also available as long as the channel forming layer is formed of the first GaN-based semiconductor layer and the second GaN-based semiconductor layer having higher bandgap energy than the first GaN-based semiconductor layer.

The second embodiment above has described that electrical connections to the respective pads of the semiconductor device are established by the bump connecting structure described with reference to FIG. 11A and FIG. 11B. It goes without saying that a similar connecting structure is also applicable in the first, and third through fifth embodiments above.

Figure 22:
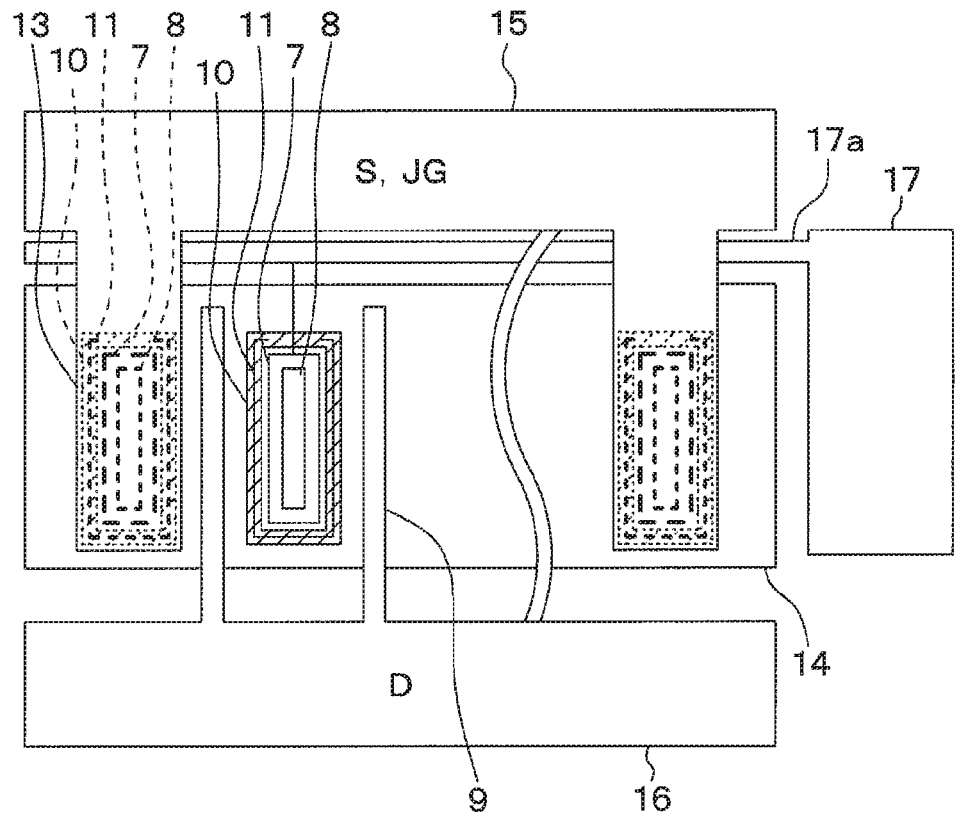
FIG. 22 is a top layout view of a semiconductor device described in other embodiments.

The respective embodiments above have described a case as is shown in, for example, FIG. 2 where the MOS gate electrode 7 and the JG electrode 11 are provided to protrude to the outside of the active region 14. The p-GaN layer 10 disposed in the same manner as the JG electrode 11 is also provided to protrude to the outside of the active region 14. However, the cases described above are a mere example. For example, as is shown in FIG. 22, the MOS gate electrode 7, the JG electrode 11, and the p-GaN layer 10 may be disposed only on the inner side of the active region 14.

The invention claimed is:
1. A semiconductor device, comprising:
   a lateral switching device, wherein the lateral switching device includes:
      a channel forming layer provided on a substrate made of a conductive material and having a heterojunction structure formed of a first semiconductor layer made of a first GaN-based semiconductor forming a drift region and a second semiconductor layer made of a second GaN-based semiconductor having higher bandgap energy than the first GaN-based semiconductor and provided with a recess portion;

a gate structure portion having a gate insulating film provided in the recess portion and a MOS gate electrode functioning as a gate electrode of a MOS structure provided on the gate insulating film;

a source electrode and a drain electrode disposed on both sides of the second semiconductor layer with the gate structure portion in between;

a third semiconductor layer made of a third GaN-based semiconductor undoped with an impurity and disposed on the second semiconductor layer at a location away from the drain electrode between the gate structure portion and the drain electrode;

a fourth semiconductor layer made of a p-type fourth GaN-based semiconductor and provided on the third semiconductor layer; and a junction gate electrode being in contact with the fourth semiconductor layer, the source electrode and the junction gate electrode are coupled through an electrode layer provided on an interlayer insulating film covering the MOS gate electrode, and an end of the third semiconductor layer facing the drain electrode protrudes toward the drain electrode from an end of the fourth semiconductor layer facing the drain electrode by a distance in a range of 1 μm to 5 μm both inclusive.

2. The semiconductor device according to claim 1, wherein
an area where the switching device is formed is used as an active region,
the electrode layer is provided at least in the active region, and
the source electrode and the junction gate electrode are coupled through the electrode layer in the active region.

3. The semiconductor device according to claim 2, wherein
the MOS gate electrode is provided to extend in one direction which is a longitudinal direction,
the electrode layer is divided into a plurality of sections along an extending direction of the MOS gate electrode and disposed in a ladder shape in the active region, and
the MOS gate electrode is connected to a gate pad between the plurality of sections of the electrode film disposed in the ladder shape.

4. The semiconductor device according to claim 1, wherein
the third semiconductor layer is in contact with the gate structure portion, and
the third semiconductor layer is disposed closer to the drain electrode than the gate structure portion and also disposed closer to the source electrode than the gate structure portion.

5. The semiconductor device according to claim 1, wherein
a resistance value of resistance components in a current path where a current flows through the junction gate electrode and the source electrode at turn-off of the switching device is given as a junction gate-source resistance value, and
the junction gate-source resistance value is set to 200 Ω mm or less.

6. The semiconductor device according to claim 5, wherein
the junction gate-source resistance value is a total resistance value of an internal resistance of the third semiconductor layer, an internal resistance of the fourth semiconductor layer, a contact resistance between the fourth semiconductor layer and the junction gate electrode, and an electrode resistance from the junction gate electrode to the source electrode.

7. The semiconductor device according to claim 1, wherein
a resistance value of resistance components in a current path where a current flows through the junction gate electrode and the source electrode at turn-off of the switching device is given as a junction gate-source resistance, and
the junction gate-source resistance value is set to 100 Ω mm or less.

8. The semiconductor device according to claim 1, wherein
a contact resistance between the fourth semiconductor layer and the junction gate electrode is set to 100 Ω mm or less.

9. The semiconductor device according to claim 1, wherein
the end of the fourth semiconductor layer facing the drain electrode protrudes toward the drain electrode from the end of the third semiconductor layer facing the drain electrode by the distance in a range of 1 μm to 4 μm both inclusive.

* * * * *